(12) United States Patent
Aoki

(10) Patent No.: US 9,299,666 B2
(45) Date of Patent: Mar. 29, 2016

(54) STACKED SEMICONDUCTOR DEVICE

(71) Applicant: CANON KABUSHIKI KAISHA, Tokyo (JP)

(72) Inventor: Takashi Aoki, Urayasu (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 44 days.

(21) Appl. No.: 13/897,659

(22) Filed: May 20, 2013

(65) Prior Publication Data

US 2013/0320569 A1 Dec. 5, 2013

(30) Foreign Application Priority Data

May 29, 2012 (JP) ................. 2012-122271

(51) Int. Cl.
*H01L 23/00* (2006.01)
*H01L 23/31* (2006.01)
(Continued)

(52) U.S. Cl.
CPC .......... *H01L 23/562* (2013.01); *H01L 23/3128* (2013.01); *H01L 25/105* (2013.01); *H01L 23/49816* (2013.01); *H01L 2224/16225* (2013.01); *H01L 2224/16227* (2013.01); *H01L 2225/1023* (2013.01);
(Continued)

(58) Field of Classification Search
CPC ................. H01L 2224/16225; H01L 23/3128; H01L 2924/15331; H01L 23/49816; H01L 2924/3511; H01L 2224/16157; H01L 2224/16227; H01L 2224/32157; H01L 2224/32227; H01L 23/4824; H01L 23/485; H01L 23/49503

USPC .......................................................... 257/777
See application file for complete search history.

(56) References Cited

U.S. PATENT DOCUMENTS

| 6,798,049 B1* | 9/2004 | Shin et al. ...................... 257/678 |
| 8,350,300 B2 | 1/2013 | Aoki |
| 2008/0067661 A1* | 3/2008 | Kawabata ...................... 257/686 |

(Continued)

FOREIGN PATENT DOCUMENTS

JP 2011-014757 1/2011

OTHER PUBLICATIONS

"Stacked Thin Dice Packaging" by Seppo K. Pienimaa, Jani Valtanen, Rami Heikkila and Eero Ristolainen. Date 2001 Electronic Components and Technology Conference.*

(Continued)

*Primary Examiner* — Eva Y Montalvo
*Assistant Examiner* — Nga Doan
(74) *Attorney, Agent, or Firm* — Fitzpatrick, Cella, Harper & Scinto

(57) ABSTRACT

A first semiconductor package which is located on an upper side includes a first printed wiring board and an encapsulation resin for encapsulating a first semiconductor chip. A second semiconductor package which is located on a lower side includes a second printed wiring board. The first printed wiring board includes first lands and a first solder resist having first openings for exposing the first lands. The second printed wiring board includes second lands opposed to the first lands, respectively, and a second solder resist having second openings for exposing the second lands and opposed to the first openings, respectively. The first lands and the second lands are solder joined to each other through the first openings and the second openings, respectively. The opening area of the first opening is set to be smaller than the opening area of the second opening. This improves joint reliability.

5 Claims, 6 Drawing Sheets

(51) Int. Cl.
*H01L 25/10* (2006.01)
*H01L 23/498* (2006.01)

(52) U.S. Cl.
CPC ............. *H01L 2225/1058* (2013.01); *H01L 2924/15331* (2013.01); *H01L 2924/3511* (2013.01)

(56) References Cited

U.S. PATENT DOCUMENTS

2008/0179738 A1* 7/2008 Nishimura et al. ........... 257/737
2010/0295179 A1* 11/2010 Watanabe et al. ............. 257/738
2011/0076808 A1* 3/2011 Sun et al. ...................... 438/125
2011/0193203 A1* 8/2011 Goto et al. .................... 257/659
2013/0122644 A1 5/2013 Aoki

OTHER PUBLICATIONS

"Tacky Dots TM Technology for Flip Chip and Bga Solder Bumping" by Allan Keikmohamadi, Allan Cairneross, John E. Gantzhorn Jr., Brian R. Quinn, and Mike A. Saltzberg. Date 1998 Electronic Components and Technology Conference.*

* cited by examiner

STACKED SEMICONDUCTOR DEVICE

BACKGROUND OF THE INVENTION

1. Field of the Invention

The present invention relates to a stacked semiconductor device having a package on package (PoP) structure in which multiple semiconductor packages are stacked in a multilayer form.

2. Description of the Related Art

As one form of a semiconductor package, a stacked semiconductor device having a PoP structure is known (see Japanese Patent Application Laid-Open No. 2011-14757). This is a structure in which a first semiconductor package as an upper semiconductor package and a second semiconductor package as a lower semiconductor package are stacked and the semiconductor packages are joined together by solder balls.

The first semiconductor package includes a first semiconductor element, and a first printed wiring board having the first semiconductor element mounted thereon. The first semiconductor element of the first semiconductor package is encapsulated in a resin. The second semiconductor package includes a second semiconductor element, and a second printed wiring board having the second semiconductor element mounted thereon. The first semiconductor element is a semiconductor chip such as a DDR memory. The second semiconductor element is a semiconductor chip such as a system LSI. The second semiconductor package is not encapsulated in a resin.

The printed wiring board of each semiconductor package has a solder resist formed thereon for covering a wiring pattern on a surface thereof. By providing openings having the same diameter in each solder resist, conductor lands formed on each printed wiring board are exposed. The lands on the printed wiring boards of the semiconductor packages are solder joined together by solder balls to form the stacked semiconductor device.

In the case of such a stacked semiconductor device, due to a difference in coefficient of linear expansion between the first semiconductor package and the second semiconductor package, warpage occurs in the stacked semiconductor device. This occurs due to a difference in coefficient of linear expansion among the encapsulation resin formed in the first semiconductor package and the first and second printed wiring boards.

Specifically, due to the difference in coefficient of linear expansion between the semiconductor packages, when the temperature changes in accordance with turning on/off the electronic apparatus, the second semiconductor package is deformed relatively in a horizontal direction and in a vertical direction with respect to the first semiconductor package. As a result, thermal stress concentrates on opening ends of a solder resist on the second printed wiring board at a solder joint portion to develop a crack at the solder joint portion.

In recent years, as the scale of the system becomes larger, more downsizing of the stacked semiconductor device is required. In order to meet the requirement, circuits are connected at a high density, fine wirings are used on the printed wiring boards, the diameters of vias for interlayer connection are reduced, and the printed wiring boards become thinner and thinner. Therefore, the problem of warpage of the stacked semiconductor device due to the change of the temperature in accordance with turning on/off of the electronic apparatus becomes more obvious.

SUMMARY OF THE INVENTION

The present invention is directed to providing a stacked semiconductor device which improves joint reliability at solder which joins a first semiconductor package and a second semiconductor package.

According to an exemplary embodiment of the present invention, there is provided a stacked semiconductor device, including a first semiconductor package and a second semiconductor package stacked thereon. The first semiconductor package includes: a first semiconductor element; a first printed wiring board having the first semiconductor element mounted on one surface thereof and having multiple first lands formed on another surface thereof, the multiple first lands each having a solder portion formed thereon; and a first resin for encapsulating the first semiconductor element. The second semiconductor package includes: a second semiconductor element; and a second printed wiring board having the second semiconductor element mounted on one surface thereof and a second land to be joined to the solder portion formed on the one surface thereof, and having multiple terminals for external connection for electrical connection to an outside formed on another surface thereof.

The first printed wiring board has a first solder resist formed on the another surface thereof, each of the multiple first lands having a part exposed through a first opening formed in the first solder resist, the exposed part of the each of the multiple first lands is joined to the solder portion. The second printed wiring board has a second solder resist formed on the one surface thereof, the second land having a part exposed through a second opening formed in the second solder resist, the exposed part of the second land is joined to the solder portion. An area of the each of the multiple first lands exposed through the first opening is smaller than an area of the second land exposed through the second opening.

According to the present invention, joint reliability at solder which joins the first semiconductor package and the second semiconductor package can be improved.

Further features of the present invention will become apparent from the following description of exemplary embodiments with reference to the attached drawings.

DESCRIPTION OF THE EMBODIMENTS

Embodiments of the present invention are described in detail in the following with reference to the attached drawings.

First Embodiment

Figure 1:
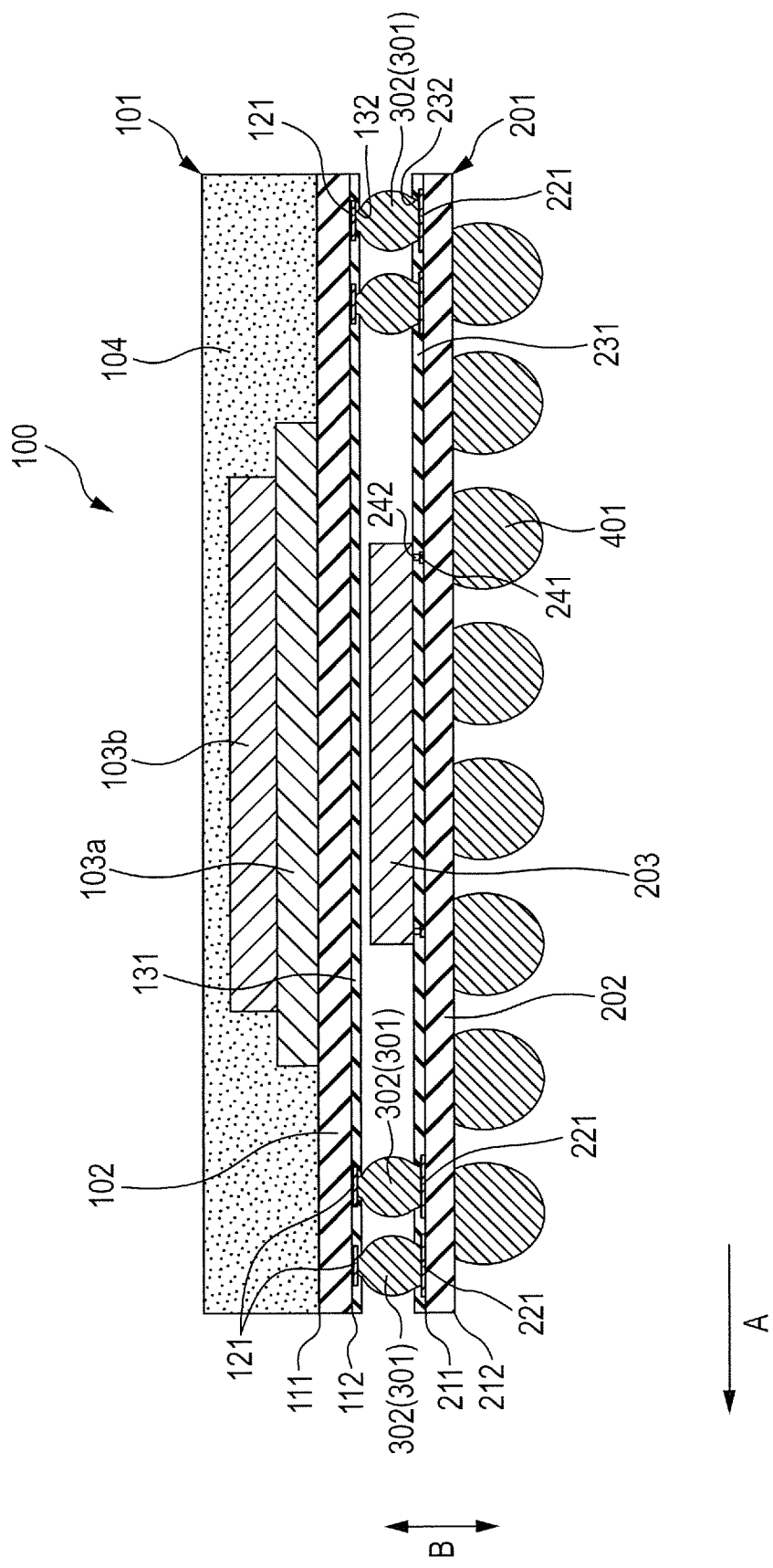
FIG. 1 is a sectional view illustrating a schematic structure of a stacked semiconductor device according to a first embodiment of the present invention.

FIG. 1 is a sectional view illustrating a schematic structure of a stacked semiconductor device according to a first embodiment of the present invention. In FIG. 1, a stacked semiconductor device 100 is a stacked semiconductor package having a PoP structure, and includes an upper semiconductor package 101 as a first semiconductor package and a lower semiconductor package 201 as a second semiconductor package. The stacked semiconductor device 100 is formed by stacking the upper semiconductor package 101 on the lower semiconductor package 201 and solder joining the upper semiconductor package 101 and the lower semiconductor package 201 by multiple solder balls 301.

The upper semiconductor package 101 includes an upper interposer 102 as a first printed wiring board which is a multilayer board, and multiple upper semiconductor chips 103a and 103b which are multiple semiconductor elements as first semiconductor elements mounted on the upper interposer 102. The multiple upper semiconductor chips 103a and 103b are vertically stacked. The upper interposer 102 is formed into the shape of a rectangle (for example, into the shape of a square) as seen from a direction perpendicular to the plane of the upper interposer 102. Each of the upper semiconductor chips 103a and 103b is also formed into the shape of a rectangle (for example, into the shape of a square) as seen from a direction perpendicular to the plane of the upper semiconductor chips 103a and 130b.

The lower semiconductor package 201 includes a lower interposer 202 as a second printed wiring board which is a multilayer board and a lower semiconductor chip 203 as a second semiconductor element that is mounted on the lower interposer 202. The lower interposer 202 is formed into the shape of a rectangle (for example, into the shape of a square) as seen from a direction perpendicular to the plane of the lower interposer 202. The lower semiconductor chip 203 is also formed into the shape of a rectangle (for example, into the shape of a square) as seen from a direction perpendicular to the plane of the lower semiconductor chip 203. The upper interposer 102 and the lower interposer 202 are formed so as to have the same surface shape and the same surface area, and are stacked so as to be coincident with each other as seen from a direction perpendicular to the plane of the interposers 102 and 202.

The lower semiconductor chip 203 is, for example, an LSI, and the upper semiconductor chips 103a and 103b are each, for example, a DDR memory.

Two surface layers 111 and 112 of the upper interposer 102 as the multilayer board are wiring layers having multiple conductor patterns formed thereon. The upper semiconductor chips 103a and 103b are mounted on the first surface layer 111 of the upper interposer 102. The multiple upper semiconductor chips 103a and 103b and the first surface layer 111 of the upper interposer 102 are encapsulated in an encapsulation resin 104.

Multiple first lands 121 as conductor lands for solder joining are formed on the second surface layer 112 on a side opposite to the first surface layer 111 of the upper interposer 102. The surfaces of these first lands 121 are formed into the shape of a circle.

Further, a first solder resist 131 for covering these first lands 121 and a wiring pattern (not shown) is formed on the second surface layer 112. The first solder resist 131 has first openings 132 formed therein for exposing the surfaces of the first lands 121 at positions corresponding to the first lands 121, respectively.

Figure 2:
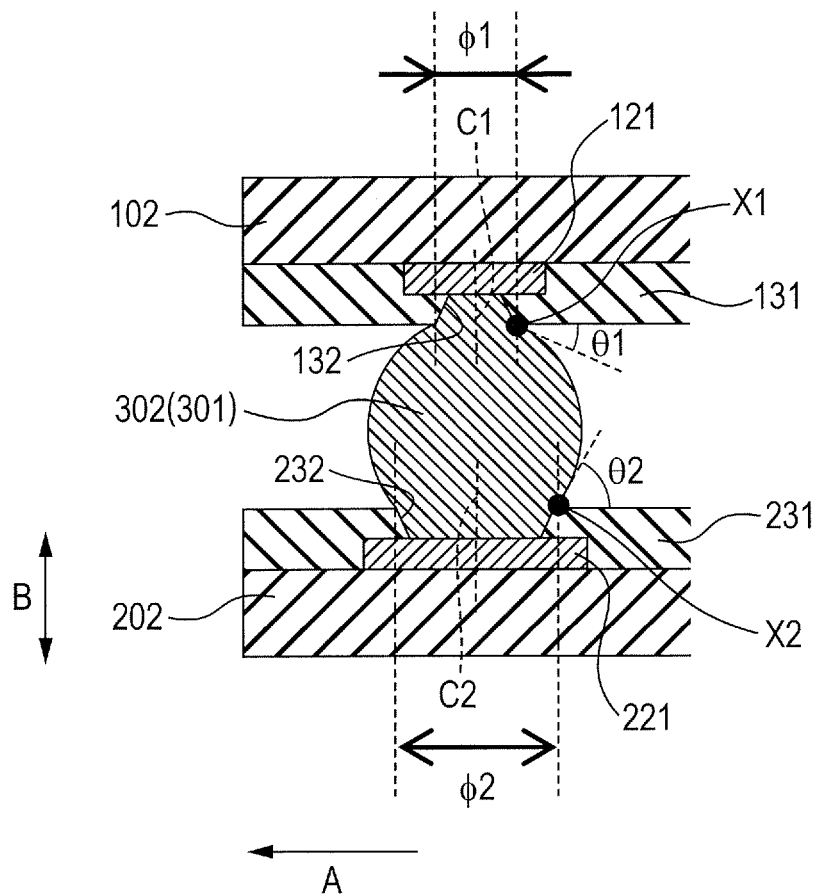
FIG. 2 is an enlarged sectional view of a portion around a solder ball of the stacked semiconductor device according to the first embodiment.

FIG. 2 is an enlarged sectional view of a portion around a solder ball of the stacked semiconductor device according to the first embodiment of the present invention. The first opening 132 is formed so as to have a smaller opening area than the surface area of the first land 121, thereby exposing a part of the surface of the first land 121.

Two surface layers 211 and 212 of the lower interposer 202 as the multilayer board illustrated in FIG. 1 are wiring layers having multiple conductor patterns formed thereon. The lower semiconductor chip 203 is mounted on the surface layer 211 of the lower interposer 202. Note that, the lower semiconductor chip 203 may be mounted on the surface layer 212 on a side opposite to the surface layer 211 of the lower interposer 202.

Multiple second lands 221 as conductor lands for solder joining are formed on the surface layer 211 of the lower interposer 202. The surfaces of these second lands 221 are formed into the shape of a circle. Further, a second solder resist 231 for covering these second lands 221 and a wiring pattern (not shown) is formed on the surface layer 211. The second solder resist 231 has second openings 232 formed therein for exposing the surfaces of the second lands 221 at positions corresponding to the second lands 221, respectively.

As illustrated in FIG. 2, the second opening 232 is formed so as to have a smaller opening area than the surface area of the second land 221, thereby exposing a part of the surface of the second land 221.

As illustrated in FIG. 1, the first lands 121 and the second lands 221 are formed at positions opposed to each other, and the first openings 132 and the second openings 232 are formed at positions opposed to each other. The first lands 121 are in peripheral arrangement in a lattice-like manner. The second lands 221 opposed to the first lands 121 are also in peripheral arrangement in a lattice-like manner.

The first lands 121 and the second lands 221 are solder joined to each other through the first openings 132 and the second openings 232 by the solder balls 301, respectively. Specifically, solder portions 302 are formed by joining the first lands 121 and the second lands 221 by the solder balls 301.

In the first embodiment, as illustrated in FIG. 2, the first opening 132 is formed into the shape of a circular truncated cone that is broadened toward an opening end of the opening. Note that, the first opening 132 may be formed into the shape of a circular cylinder. In other words, it is preferred that the first opening 132 be formed into the shape of a circle as seen from a direction perpendicular to the surface of the first solder resist 131. This inhibits concentration of thermal stress on a part in a circumferential direction of the solder portion 302 formed of the solder ball 301.

Further, the second opening 232 is formed into the shape of a circular truncated cone that is broadened toward an opening end of the opening. Note that, the second opening 232 may be formed into the shape of a circular cylinder. In other words, it is preferred that the second opening 232 be formed into the shape of a circle as seen from a direction perpendicular to the surface of the second solder resist 231. This inhibits concentration of thermal stress on a part in a circumferential direction of the solder portion 302 formed of the solder ball 301.

As illustrated in FIG. 1, the lower semiconductor chip 203 is joined to conductor lands 241 formed on the surface layer 211 of the lower interposer 202 by bumps 242. Note that, multiple solder balls 401 as external connection terminals that are connected to conductor lands (not shown) are provided on the surface layer 212 of the lower interposer 202.

As illustrated in FIG. 2, the solder portion 302 formed of the solder ball 301 has a region which protrudes outside the first opening 132 and the second opening 232 due to surface tension, and forms a spherical surface. The solder portion 302 is provided in contact with an opening end of the first opening 132 in the first solder resist 131 at a first contact point X1. The solder portion 302 is provided in contact with an opening end of the second opening 232 in the second solder resist 231 at a second contact point X2.

Note that, in the first embodiment, the solder portion 302 is described as not extending on the surfaces of the solder resists 131 and 231, but the solder portion 302 may extend on the surfaces of the solder resists 131 and 231.

In the first embodiment, the coefficient of linear expansion of the upper interposer 102 is substantially the same as the coefficient of linear expansion of the lower interposer 202. Further, the coefficient of linear expansion of the encapsulation resin 104 is smaller than the coefficient of linear expansion of the interposers 102 and 202. The upper semiconductor package 101 includes the multiple upper semiconductor chips 103a and 103b, and thus, the vertical thickness of the encapsulation resin 104 is larger than that of the upper interposer 102. Therefore, the coefficient of linear expansion of the encapsulation resin 104 is dominant in the coefficient of linear expansion of the upper semiconductor package 101. Accordingly, the lower interposer 202 is deformed relatively in a horizontal direction indicated by an arrow A with respect to the upper interposer 102.

Further, in the first embodiment, the lower semiconductor chip 203 is not encapsulated in an encapsulation resin. Therefore, warpage of the lower interposer 202 that occurs due to a difference in coefficient of linear expansion between the lower semiconductor chip 203 and the lower interposer 202 which is caused when heat is generated by operation of the lower semiconductor chip 203 is not inhibited, and the lower interposer 202 is deformed in a vertical direction indicated by an arrow B.

In the first embodiment, the opening area of the first opening 132 is smaller than the opening area of the second opening 232. In other words, the opening area of the second opening 232 is larger than the opening area of the first opening 132. Specifically, the opening end of the first opening 132 is in the shape of a circle having a diameter of $\phi 1$, and the opening end of the second opening 232 is in the shape of a circle having a diameter of $\phi 2$ which is larger than the diameter $\phi 1$.

As illustrated in FIG. 2, the contact angle between the surface of the first solder resist 131 and the surface of the solder portion 302, that is, the wetting angle of the solder portion 302 with respect to the surface of the first solder resist 131, is represented by $\theta 1$. In the first embodiment, the angle $\theta 1$ is an angle at the first contact point X1. Further, the contact angle between the surface of the second solder resist 231 and the surface of the solder portion 302, that is, the wetting angle of the solder portion 302 with respect to the surface of the second solder resist 231, is represented by $\theta 2$. In the first embodiment, the angle $\theta 2$ is an angle at the second contact point X2. In the first embodiment, the first opening 132 and the second opening 232 are opposed to each other so that both the angle $\theta 1$ and the angle $\theta 2$ are acute angles over the entire circumference. This can secure the distance between the lower semiconductor chip 203 and the upper interposer 102.

Note that, in a case in which the angle $\theta 1$ and the angle $\theta 2$ are set to obtuse angles over the entire circumference by constricting the solder portion in the middle, it is conceivable that concentration of strain is able to be avoided as well. However, in that case, a manufacturing step is required to be complicated. Specifically, in a step of joining the upper package and the lower package, or, in a step of joining the stacked semiconductor device and the motherboard, heating is necessary while keeping the distance between the upper package and the lower package constant. According to the first embodiment, the joint reliability can be improved without complicating a manufacturing step in this way.

It is particularly preferred that a center C1 of the first opening 132 and a center C2 of the second opening 232 be coincident. Specifically, by causing the pitches of the first openings 132 and the pitches of the second openings 232 to be the same and causing the first openings 132 and the second openings 232 to be opposed to each other, the centers C1 of the first openings 132 and the centers C2 of the second openings 232 can be coincident, respectively.

In this case, the lengths of the interposers 102 and 202 in the horizontal direction vary depending on the temperature, and thus, it is enough that the centers C1 of the first openings 132 and the centers C2 of the second openings 232 are coincident under a certain temperature environment. Examples of the certain temperature environment include a case in which the first lands 121 and the second lands 221 are solder joined by the solder balls 301 in the manufacturing steps, a case in which operation of the lower semiconductor chip 203 and the upper semiconductor chips 103a and 103b is stopped, and a case in which at least one of the lower semiconductor chip 203 and the upper semiconductor chips 103a and 103b is operated.

With reference to FIG. 2, thermal stress is applied to the solder portion 302 due to a difference in coefficient of linear expansion between the encapsulation resin 104 and the lower interposer 202. In the first embodiment, the diameter of the second opening 232 is larger than the diameter of the first opening 132, and thus, the angle $\theta 2$ between the solder portion 302 and the second solder resist 231 is larger. On the other hand, the angle $\theta 1$ is smaller. This causes force which otherwise concentrates on the second contact point X2 to be evenly distributed to the first contact point X1 and the second contact point X2. Therefore, strain applied to the solder portion 302 at the second contact point X2 is reduced to improve crack resistance. In this way, joint reliability at the solder portion 302 that joins the upper semiconductor package 101 and the lower semiconductor package 201 can be improved.

Further, in the first embodiment, the openings 132 and 232 are each formed into the shape of a circular truncated cone that is broadened from the bottom surface thereof toward the opening end of the opening, and thus, force which acts on the solder portion 302 at the opening ends of the openings 132 and 232 is reduced. This can effectively inhibit occurrence of crack in the solder portion 302 to increase the life of the stacked semiconductor device 100.

Second Embodiment

Figure 3:
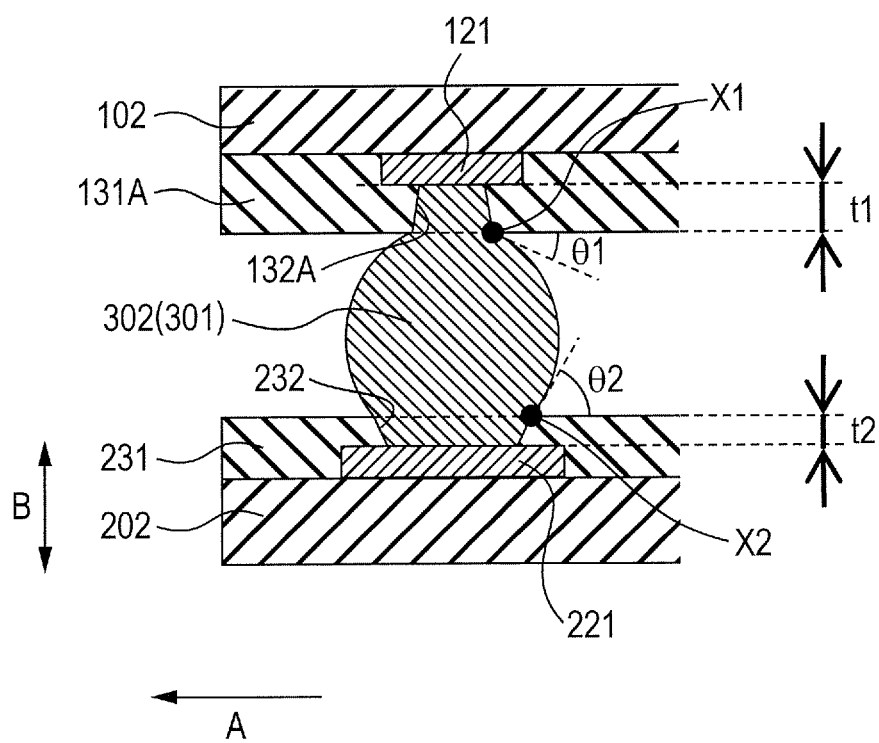
FIG. 3 is an enlarged sectional view of a portion around a solder ball of a stacked semiconductor device according to a second embodiment of the present invention.

Next, a stacked semiconductor device according to a second embodiment of the present invention is described. FIG. 3 is an enlarged sectional view of a portion around a solder ball of the stacked semiconductor device according to the second embodiment of the present invention. Note that, in the second embodiment, like reference numerals are used to designate like members in the first embodiment and description thereof is omitted.

In the stacked semiconductor device according to the second embodiment, a depth t1 of a first opening 132A in a first solder resist 131A is larger than a depth t2 of the second opening 232 in the second solder resist 231.

When the first opening 132A has a certain depth, a part of force applied to the solder portion 302 is absorbed by a contact surface between a side wall surface of the first opening 132A in the first solder resist 131A and the solder portion 302. Therefore, as the depth of the first opening 132A becomes larger, the strain that occurs at the first contact point X1 becomes smaller.

According to the second embodiment, the strain applied to the solder portion 302 at the first contact point X1 can be reduced, and the first opening 132A can be formed smaller accordingly. Therefore, the strain applied to the solder portion 302 at the second contact point X2 can be reduced.

By the way, the thickness of the second solder resist 231 (the depth t2 of the second opening 232) depends on the height of the bumps 242 which join the lower semiconductor chip 203 mounted on the surface layer 211 and the conductor lands 241 formed on the surface layer 211 of the lower interposer 202. On the other hand, the second surface layer 112 of the upper interposer 102 does not have a semiconductor element to be joined thereto through bumps, and thus, the thickness of the first solder resist 131A (the depth t1 of the first opening 132A) can be adjusted.

Therefore, in the stacked semiconductor device according to the second embodiment, the thickness of the second solder resist 231 is fixed, and the depth t1 of the first opening 132A in the first solder resist 131A is larger than the depth t2 of the second opening 232 in the second solder resist 231.

This eliminates the necessity of varying the thickness of the second solder resist 231 between portions at which the bumps 242 are provided and portions at which the solder balls 301 are provided, and the thickness of the second solder resist 231 can be fixed, which facilitates the manufacture.

EXAMPLES

Example 1

In Example 1, the result of a simulation and an experiment which were performed with regard to the structure of the stacked semiconductor device of the above-mentioned first embodiment is described. Note that, the simulation was performed using I-deas (manufactured by Siemens PLM Software) that is a commercially available simulator.

The diameter of the solder balls 301 in the shape of a true sphere before connection was 250 µm. The diameter of the second openings 232 was 240 µm, and the diameter of the first openings 132 was 210 µm and 180 µm. The difference in coefficient of linear expansion between the upper semiconductor package 101 and the lower semiconductor package 201 was 18 ppm/° C. For the sake of easy understanding, the height of the solder portions 302 was fixed (146 µm).

Figure 4:
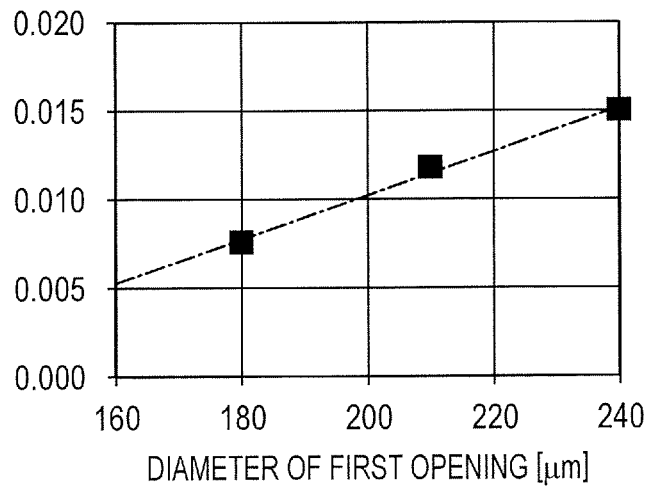
FIG. 4 is a graph showing strain which acts on a solder portion of a stacked semiconductor device in Example 1.

FIG. 4 is a graph showing the result of a simulation of the strain which acted on the solder portion 302 of the stacked semiconductor device in Example 1 at the second contact point X2. For comparison, the simulation was also performed with regard to the strain that acted on a solder portion of a conventional stacked semiconductor device. The result thereof is also shown in FIG. 3. In the simulation of the comparative example, both the diameter of the first openings 132 and the diameter of the second openings 232 were 240 µm, and the rest of the data were the same as those in Example 1.

With reference to FIG. 4, as the diameter of the first opening 132 becomes smaller, the strain which acts on the solder portion 302 is more reduced. It can be seen that, compared with the case of the comparative example, in Example 1, the strain at the second contact point X2 is reduced by about 50%.

Figure 5:
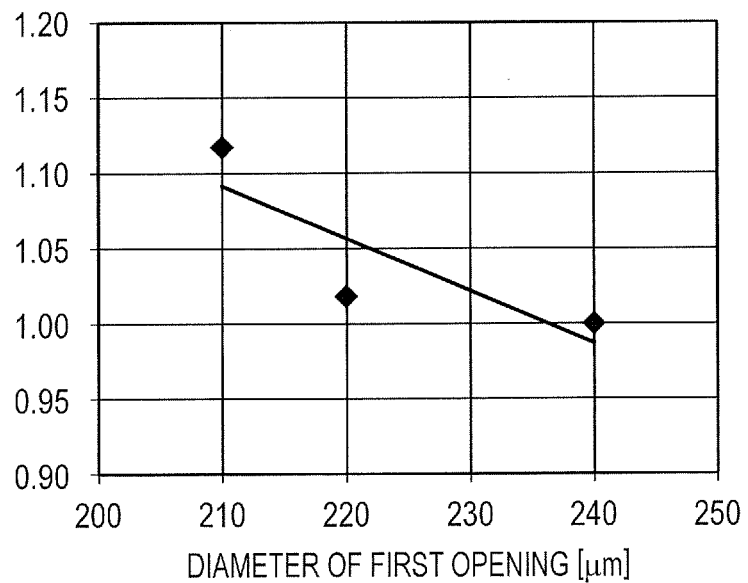
FIG. 5 is a graph showing the result of a thermal fatigue test of the stacked semiconductor device in Example 1.

FIG. 5 is a graph showing the result of a thermal fatigue test of the stacked semiconductor device in Example 1. As Example 1, samples were manufactured in which the diameter of the solder balls 301 before joining was 250 µm, the diameter of the second openings 232 was 240 µm, and the diameter of the first openings 132 was 210 µm and 220 µm. Temperature change was repeatedly applied to the manufactured samples, a time at which a crack was developed in the solder portion 302 was statistically processed, and 0.1% fault occurrence time was determined. Further, for comparison, the test was also conducted with regard to a sample as a comparative example where the diameter of the first openings 132 was 240 µm. The result thereof is also shown in FIG. 5.

It can be seen that, from FIG. 5, as the opening area of the first opening 132 becomes smaller, time taken for a crack to develop in the solder portion 302 becomes longer by 13% at the maximum, and fault is less liable to occur. Specifically, compared with the case of the comparative example, in Example 1, the joint reliability can be greatly improved.

If the height of the solder portions 302 is not sufficiently large compared with the thickness of the lower semiconductor chip 203, the upper semiconductor package 101 and the lower semiconductor chip 203 are brought into contact with each other to damage the lower semiconductor chip 203.

On the other hand, according to Example 1, the height of the solder portions 302 can be increased than that in a conventional case, and thus, damage to the lower semiconductor chip 203 can be prevented.

As described above, according to Example 1, even when the effect of the encapsulation resin 104 is dominant, thermal fatigue resistance can be improved. Therefore, while filling the need for enlarging the scale of the system, the joint reliability at a joint between the upper and lower semiconductor packages in the stacked semiconductor device 100 can be improved.

Example 2

In Example 1 described above, by causing the first openings 132 to be smaller than the second openings 232 and by causing the angle θ2 between the solder portion 302 and the second solder resist 231 of the lower interposer 202 at the second contact point X2 to be larger, the strain at the second contact point X2 was reduced.

On the other hand, with regard to the first openings 132, the joint area was reduced, and the angle θ1 at the first contact point X1 became more acute. Therefore, the strain applied to the solder portion 302 at the first contact point X1 tends to increase. When the magnitude of the strain at the first contact point X1 and the magnitude of the strain at the second contact point X2 are the same, the thermal stress due to the difference in coefficient of linear expansion is in a state of being distributed in the entire solder, in which the joint reliability is the highest.

Figure 6:
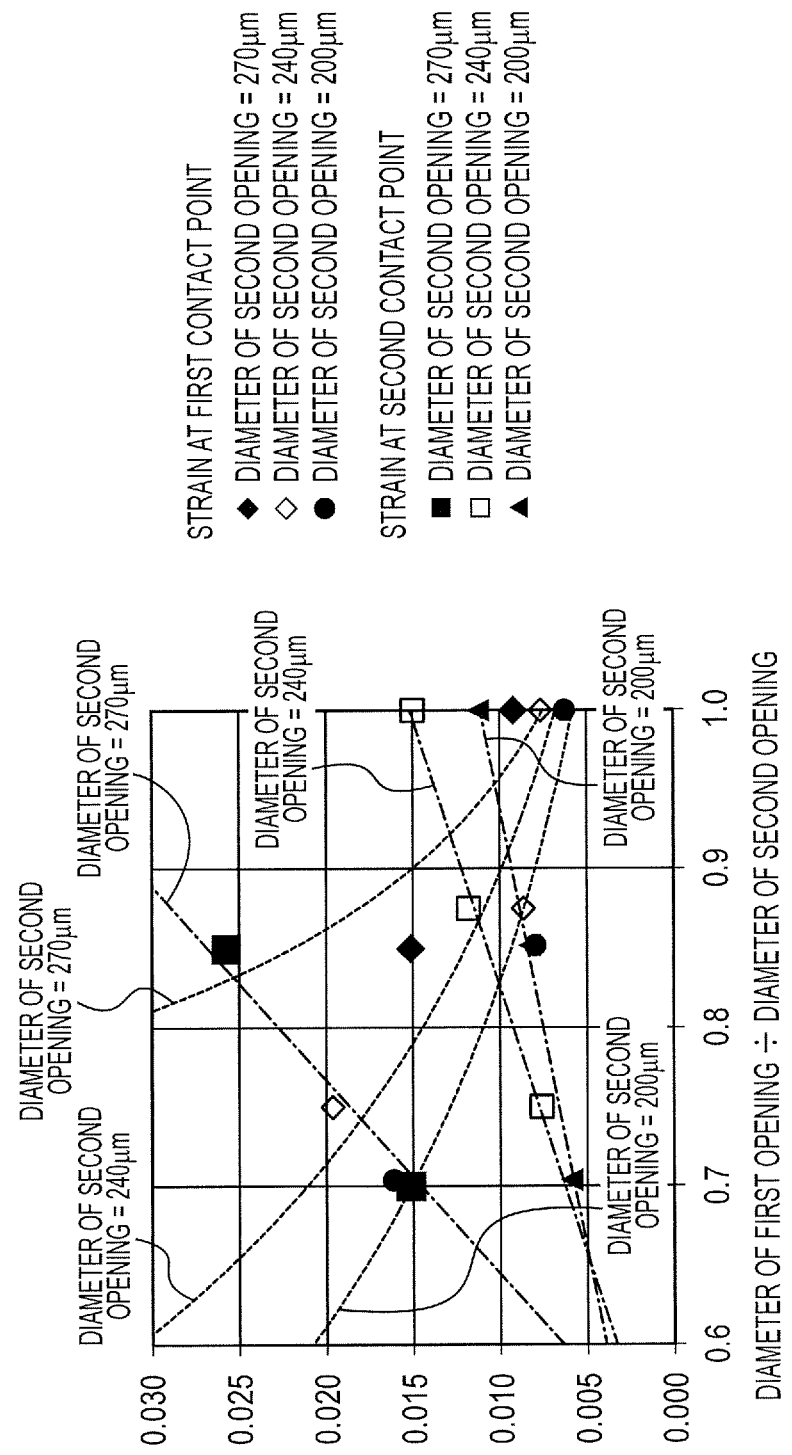
FIG. 6 is a graph showing strain which acts on a solder portion of a stacked semiconductor device in Example 2.

FIG. 6 is a graph showing the result of a simulation of strain at the first and second contact points X1 and X2 in Example 2, where the diameter of the second openings 232 is fixed (in this case, fixed to 200, 240, and 270 µm) and the diameter of the first openings 132 is changed.

The diameter of the solder balls 301 in the shape of a true sphere before connection was 250 µm. The difference in coefficient of linear expansion between the upper semiconductor package 101 and the lower semiconductor package 201 was 18 ppm/° C. The height of the solder portions 302 was fixed (146 µm).

As the first opening 132 becomes smaller, the strain at the second contact point X2 is reduced (indicated by alternate long and short dash lines). On the other hand, the strain at the first contact point X1 is increased (indicated by dashed lines). This is because the angle θ1 becomes more acute, and, in addition, the joint area at the first opening 132 is reduced. The strain at the first contact point X1 changes at a higher rate than the strain at the second contact point X2.

When the magnitude of the strain at the first contact point X1 and the magnitude of the strain at the second contact point X2 are the same (at a point of intersection of an alternate long and short dash line and a dashed line), the thermal stress is in a state of being distributed in the entire solder portion 302. In the case in which the diameter of the second openings 232 is 200 μm, the magnitude of the strain at the first contact point X1 and the magnitude of the strain at the second contact point X2 are the same when the opening ratio is 0.87. In the cases in which the diameter of the second openings 232 is 240 μm and 270 μm, the magnitude of the strain at the first contact point X1 and the magnitude of the strain at the second contact point X2 are the same when the opening ratio is 0.87 and 0.83, respectively. From the foregoing, it can be seen that, when the opening ratio is about 0.85, the thermal stress is distributed in the entire solder portion.

Each of the diameters of the first and second openings 132 and 232 is controlled to have dimensions determined by adding a tolerance to a design value and a tolerance, and thus, a tolerance is also added to the opening ratio. In this case, when multiple openings are formed, it is necessary to set the tolerance of the opening ratio so that the number of openings which conform to the design value is the largest. Further, as the diameter of the opening becomes larger, partial peeling of the resist is more liable to occur, and thus, generally, a plus tolerance with respect to the design value is more strictly controlled than a minus tolerance. By setting the tolerance of the opening ratio to be between +0.05 and −0.10 and controlling the opening ratio to be 0.75 or more and 0.9 or less, a stacked semiconductor device having an opening ratio of 0.85 which is an ideal value can be easily manufactured.

In this case, as the size of the second opening 232 (opening area) is reduced, both the strain at the first contact point X1 and the strain at the second contact point X2 are increased, but the opening ratio at which the magnitude of the two are the same, hardly changes. This is because both the angles θ1 and θ2 at the points X1 and X2, respectively, becomes more acute. Further, also when the size of the second opening 232 (opening area) is increased, the opening ratio at which the magnitude of the two are the same hardly changes.

Therefore, it can be seen that, when the ratio of the diameters of the first and second openings 132 and 232 is 0.75 or more and 0.9 or less, that is, when the ratio of the opening area of the first opening 132 to the opening area of the second opening 232 is in a range of 0.56 or more and 0.81 or less, the joint reliability is more improved. In this case, the stress does not concentrate on any one of the first and second contact points X1 and X2, and the balance is achieved.

Note that, in FIG. 6, the size of the solder portion 302 was fixed. As the solder portion 302 becomes larger, both the angles θ1 and θ2 at the first and second contact points X1 and X2 between the first solder resist 131 and the solder portion 302 and between the second solder resist 231 and the solder portion 302, respectively, become more acute. Specifically, the tendency is the same as in a case in which the second opening 232 becomes smaller in FIG. 6. Therefore, both the strain at the first contact point X1 and the strain at the second contact point X2 are increased, but the condition under which the magnitude of the two are the same does not change. Further, when the difference in coefficient of linear expansion becomes larger, external force applied to the solder portion 302 becomes larger. Therefore, both the magnitude of the strain at the first contact point X1 and the magnitude of the strain at the second contact point X2 are increased, but the condition under which the magnitude of the two are the same does not change.

Therefore, in the stacked semiconductor device in Example 2, the strain at the first contact point X1 and the strain at the second contact point X2 are balanced, and not only concentration of stress on the second contact point X2 but also concentration of stress on the first contact point X1 can be avoided.

As described above, by setting the opening areas of the openings 132 and 232 so that the ratio of the opening area of the first opening 132 to the opening area of the second opening 232 is in a range of 0.56 or more and 0.81 or less, the joint reliability can be further improved.

Example 3

In Example 3, the result of a simulation performed with regard to the stacked semiconductor device of the above-mentioned second embodiment is described. In Example 3, as illustrated in FIG. 3, the first opening 132A is formed so as to be deeper than the second opening 232.

When the first opening 132A has a certain depth, a part of force applied to the solder portion 302 is absorbed by the contact surface between the first solder resist 131A in the first opening 132A and the solder portion 302. Therefore, as the depth of the first opening 132A becomes larger, the strain at the contact point X1 becomes smaller.

Figure 7:
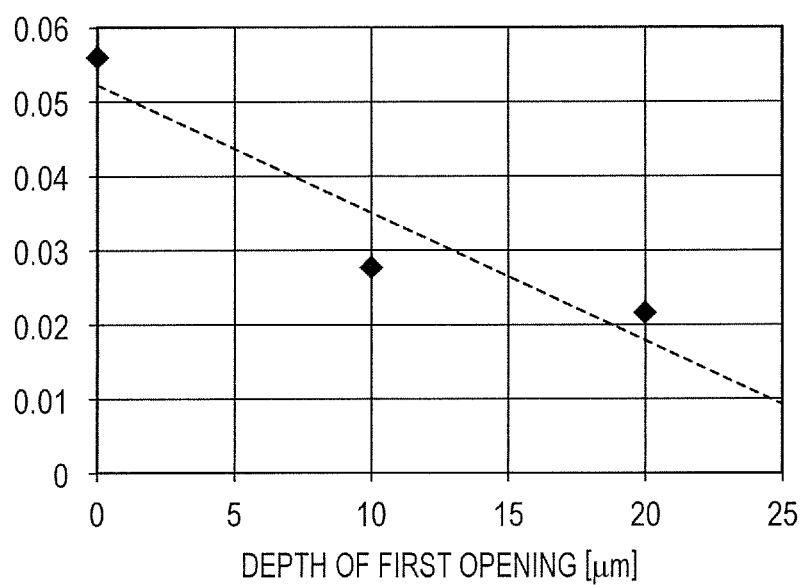
FIG. 7 is a graph showing strain that occurs at a first contact point when the depth of a first opening changes.

FIG. 7 is a graph showing the result of a simulation of strain that occurs at the first contact point X1 when the depth t1 of the first opening 132A changes. In Example 3, the diameter of the first and second openings 132A and 232 was 180 μm, the diameter of the solder balls 301 in the shape of a true sphere before connection was 250 μm, and the difference in coefficient of linear expansion between the upper semiconductor package 101 and the lower semiconductor package 201 was 18 ppm/° C. The height of the solder portions 302 was fixed (146 μm). With reference to FIG. 7, it can be seen that, by causing the depth of the first opening 132A to be larger, the strain applied to the solder portion 302 at the first contact point X1 is reduced.

If the depth t2 of the second openings 232 becomes larger, a step of mounting the lower semiconductor chip 203 on the lower interposer 202 becomes complicated. The lower semiconductor chip 203 and the conductor lands 241 in the lower interposer 202 are connected by the bumps 242 (having a height of, for example, 40 μm). However, if the depth t2 of the second openings 232 is larger than the height of the bumps 242, the lower semiconductor chip 203 and the lower interposer 202 are brought into contact with each other and the bumps 242 cannot reach the conductor lands 241, and thus, no electrical connection is established. Therefore, it is necessary to, in the lower interposer 202, change the second solder resist 231 (the depth of the opening) between a portion on which the lower semiconductor chip 203 is to be mounted and portions on which the solder balls 301 are to be mounted, which complicates the step.

On the other hand, in Example 3, the strain at the first contact point X1 can be reduced, and thus, the first opening 132A is formed smaller accordingly. Therefore, the strain at the second contact point X2 can be reduced. According to Example 3, the joint reliability can be further improved without complicating the step of mounting the lower semiconductor chip 203 on the lower interposer 202.

Note that, the present invention is not limited to the embodiments and the examples described above, and various modifications can be made thereto by those with an ordinary skill in the art within the technical idea of the present invention.

In the above description, cases in which the lower semiconductor package 201 is a package without an encapsulation resin and the upper semiconductor package 101 is a package encapsulated in an encapsulation resin are described, but it is apparent that a similar effect can be obtained insofar as the upper package and the lower package have different coefficients of linear expansion. For example, the lower semiconductor package may be a package without an encapsulation resin and the upper semiconductor package may be a wafer level package (WLP).

Further, in the above description, cases in which the upper semiconductor package 101 includes the multiple upper semiconductor chips 103a and 103b as multiple semiconductor elements are described, but the present invention is not limited thereto. The present invention is also applicable to a case in which the first semiconductor package as the upper semiconductor package includes only one semiconductor element as a first semiconductor element.

Further, in the above description, cases in which the first lands 121 and the second lands 221 are solder joined by the solder balls 301 are described, but the structure is not limited to solder balls, and any structure is possible insofar as the first lands 121 and the second lands 221 are solder joined to each other. For example, the first lands 121 and the second lands 221 may be solder joined to each other by connection terminals formed by applying solder onto outer peripheries of rigid balls.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-122271, filed May 29, 2012, which is hereby incorporated by reference herein in its entirety.

What is claimed is:

1. A stacked semiconductor device, comprising:
a first semiconductor package comprising:
    a first semiconductor element;
    a first printed wiring board having the first semiconductor element mounted on a first surface thereof and having multiple first lands formed on a second surface thereof, the multiple first lands each having a solder portion formed thereon; and
    a first resin encapsulating the first semiconductor element; and
a second semiconductor package comprising:
    a second semiconductor element; and
    a second printed wiring board having the second semiconductor element mounted on a first surface thereof and a second land to be joined to the solder portion formed on the first surface thereof, and having multiple terminals for external electrical connection of the stacked semiconductor device formed on a second surface thereof, wherein:
the first semiconductor package is stacked on the first surface of the second semiconductor package, such that the first semiconductor package is electrically connected to the second semiconductor package through the solder portion;
the first printed wiring board has a first solder resist formed on the second surface thereof, each of the multiple first lands having a part joined to the solder portion through a first opening formed in the first solder resist;
the second printed wiring board has a second solder resist formed on the one surface thereof, the second land having a part joined to the solder portion through a second opening formed in the second solder resist;
an area of each of the multiple first lands joined to the solder portion through the first opening is smaller than an area of the second land joined to the solder portion through the second opening; and
a ratio of the area of each of the multiple first lands joined to the solder portion through the first opening to the area of the second land joined to the solder portion through the second opening is 0.56 or more and 0.81 or less.

2. The stacked semiconductor device according to claim 1, wherein a depth of the first opening is larger than a depth of the second opening.

3. The stacked semiconductor device according to claim 1, wherein at least one of each of the multiple first openings and the second opening is formed into a shape of a circular truncated cone that is broadened toward an opening end of the opening.

4. The stacked semiconductor device according to claim 1, wherein the first semiconductor element comprises a stacked semiconductor element formed by stacking multiple semiconductor elements.

5. A stacked semiconductor device, comprising:
a first semiconductor package comprising:
    a first semiconductor element;
    a first printed wiring board having the first semiconductor element mounted on a first surface thereof and having multiple first lands formed on a second surface thereof, the multiple first lands each having a solder portion formed thereon; and
    a first resin for encapsulating the first semiconductor element; and
a second semiconductor package comprising:
    a second semiconductor element; and
    a second printed wiring board having the second semiconductor element mounted on a first surface thereof and a second land to be joined to the solder portion formed on the first surface thereof, and having multiple terminals for external connection for electrical connection to outside formed on a second surface thereof, wherein:
the first semiconductor package is stacked on the first surface of the second semiconductor package, such that the first semiconductor package is electrically connected to the second semiconductor package through the solder portion;
an area of each of the multiple first lands is smaller than an area of the second land; and
a ratio of the area of each of the multiple first lands to the area of the second land is 0.56 or more and 0.81 or less.

* * * * *